United States Patent [19]

Dingwall et al.

[11] Patent Number: 4,507,649
[45] Date of Patent: Mar. 26, 1985

[54] FLASH A/D CONVERTER HAVING REDUCED INPUT LOADING

[75] Inventors: Andrew G. F. Dingwall, Bridgewater; Victor Zazzu, Montvale, both of N.J.

[73] Assignee: RCA Corporation, New York, N.Y.

[21] Appl. No.: 381,732

[22] Filed: May 24, 1982

[51] Int. Cl.³ .................. H03K 13/02; H03K 13/175
[52] U.S. Cl. .............................. 340/347 AD; 307/451; 307/585
[58] Field of Search .... 340/347 M, 347 AD, 347 CC; 307/584, 585, 450, 451

[56] References Cited

U.S. PATENT DOCUMENTS 3,676,702  7/1972  McGrogan, Jr. .................. 307/235

OTHER PUBLICATIONS

"CMOS/SOS Flash ADC Speeds on Low Power for Low Cost", M. Glincman, *Electronic Design*, Nov. 22, 1980, pp. 227-231.

*Primary Examiner*—T. J. Sloyan
*Attorney, Agent, or Firm*—E. M. Whitacre; P. J. Rasmussen; E. P. Herrmann

[57] ABSTRACT

A flash analog-to-digital converter includes $2^N$ comparator circuits for an N bit resolution. Each comparator comprises a summing capacitor which is alternately connected to a reference ladder and to the input signal. The majority of the capacitors are substantially charged and discharged between input potential and reference potential each cycle. The charging/discharging tends to load both the reference ladder and the input signal source. The loading is reduced by including a D.C. biased FET between the input signal source and each summing capacitor. The FET's are biased to condition them to operate as source-followers with the summing capacitors as the load element for at least a portion of the input signal range. Respective ones of the summing capacitors are thereby precluded from charging/discharging over the full input signal excursion which in turn reduces loading on associated circuitry.

6 Claims, 4 Drawing Figures

FLASH A/D CONVERTER HAVING REDUCED INPUT LOADING

This invention relates to flash analog-to-digital (A/D) converters and in particular to comparator circuitry for a flash type A/D converter.

The flash type A/D converter simultaneously compares an input signal to a large number of reference potentials. A six bit converter with overflow requires $2^6$ or 64 simultaneous comparisons, an eight bit converter requires 256 comparisons. In order to realize the flash converter with managable circuitry, i.e., to make it economically practical, relatively simple comparator circuits are utilized. One circuit that has been employed with success at least for six bit converters is described in U.S. Pat. No. 3,676,702 issued to E. P. McGrogan, Jr. and entitled "Comparator Circuit". The McGrogan, Jr. circuit alternately switches first a reference potential, then a signal potential to the first plate of a summing capacitor. The second plate of the summing capacitor is connected to the input of an inverter circuit which is selectively biased at its trip point or threshold potential each time the reference potential is applied. Very small differences between the input signal and the reference signal can accurately be determined, i.e., an input signal very slightly greater (lesser) than the reference signal will cause the inverter to trip negative (positive).

The McGrogan, Jr. circuit utilizes complementary transmission gates comprised of complementary field effect transistors (FETs) to alternately apply reference potential or signal potential to the summing capacitor. Complementary transmission gates ostensibly tend to reduce the amount of switch pulse potential coupled to the summing capacitor via stray or otherwise unavoidable capacitances inherent in the switching transistors (gates). Each complementary gate comprises an N-type FET and a P-type FET connected in parallel with their respective control electrodes concurrently energized with complementary signals of equal amplitude. All things being equal any switching pulse signals coupled to the signal circuitry by one transistor will be compensated or eliminated by coupling due to the other transistor.

Circuit measurements of existing flash A/D converters of this type tend to indicate that in fact switching pulse signals are not completely cancelled due to the existence of non-equal gate-drain capacitance between the self-compensating transistors. One of the effects of imperfect compensation is the coupling of switching spikes onto the signal input bus. This tends to degrade the input signal and thereby affect either converter sensitivity or conversion speed. This effect can be counteracted by the imposition of a low impedance buffer amplifier connected serially in the signal input line ahead of the comparator. However for such an amplifier to be realized on an MOS integrated circuit requires appreciable silicon area.

A second factor which imposes a sensitivity limitation on the flash converter arises from current loading the reference ladder. Consider the input signal to be low. Application of this signal during the comparison cycle essentially discharges all the summing capacitors. Subsequent recharging of the summing capacitors during the next system cycle tends to load the ladder thereby introducing nonlinearities and substantially reducing the cycle rate of the converter, or, for a fixed cycle time, reducing the sensitivity of the converter.

Input signals which are at the extremes of the operative signal range must either charge or discharge substantially all of the summing capacitors. This imposes relatively high current demands on the input signal source tending to load many input signal circuits. This type of loading also affects the conversion time of the system or at least poses a conversion time-conversion accuracy tradeoff.

SUMMARY OF THE INVENTION

The present invention overcomes the foregoing limitations by limiting the amount of charge that can be displaced on any given summing capacitor via the signal input bus and by isolating each of the signal input switches from the signal input bus by respective serial impedances. A field effect transistor is connected between each signal input switch and the signal input bus. The gate electrodes of the FET's are biased at D.C. potentials which are tailored to the relative position of the respective FET's along the resistive ladder. The FET's are constrained to operate in the source follower mode for certain ranges of the input signal so that the individual summing capacitors cannot charge/discharge to a potential exceeding the respective FET D.C. gate potential minus the threshold potential of the transistor, thereby reducing loading on the resistive ladder. The drain-source impedance of the respective FET's shields the signal input bus from clock feedthrough attendant the signal input switches.

DETAILED DESCRIPTION OF THE INVENTION

Figure 1:
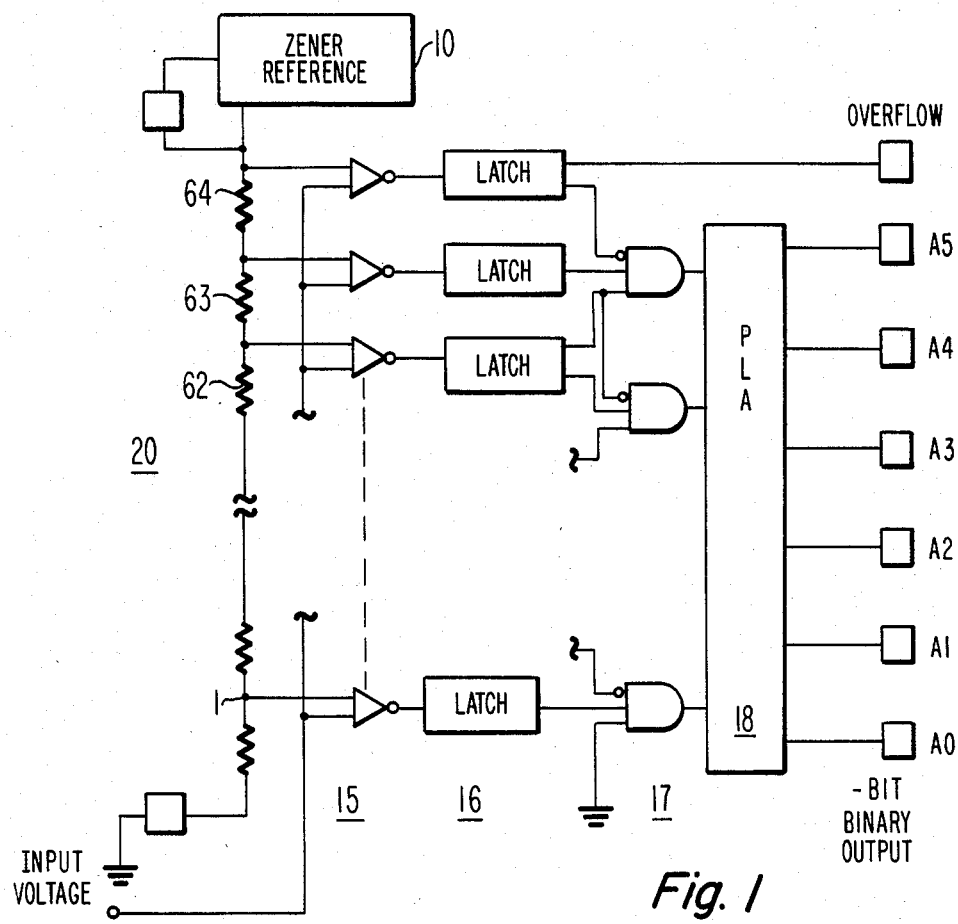
FIG. 1 is a block diagram of a six bit flash A/D converter.

Referring to FIG. 1, a representative flash A/D converter is shown which is capable of producing the parallel six bit binary output signal A$\phi$ to A5. The six bit output signal corresponds to apportioning the maximum permitted input signal (i.e., the operable input voltage range) into 64 or $2^6$ ascending values. This is accomplished by applying a known voltage (10) across a linear resistor (20) and tapping the potential dropped across the resistor (20) at 64 equally spaced intervals. Each of the resistor taps from 1 to 64 exhibits incrementally increasing reference voltages. The signal input voltage is compared to each of the tap reference voltages by 64 comparators (15) operating in parallel. The output of all of the comparators connected to reference taps having a voltage value less than the input potential will exhibit one output state and the remaining comparators will exhibit a second output state.

The comparators (15) are clocked to sample or compare the input signal at prescribed intervals. At the end of a sampling period the output states of the comparators are latched into 64 respective parallel latch circuits (16).

The latched output signals are applied to 63 parallel three-input AND circuits (17). Each of the AND circuits examines triplets of successive ascending comparator states. The respective AND circuits will produce an output signal only for the condition that two adjacent latches connected to the AND circuit are exhibiting a logical "high" output state and the next ascending latch is exhibiting a logical "low" output state. By employing this arrangement only one of the 63 AND circuits will produce an output signal for a given input sample.

The output terminals of the AND circuits (17) are applied to a programmable logic array or PLA (18) which produces a parallel six bit binary output signal A$\phi$-A5 related to the particular AND circuit currently exhibiting an output signal.

Figure 2:
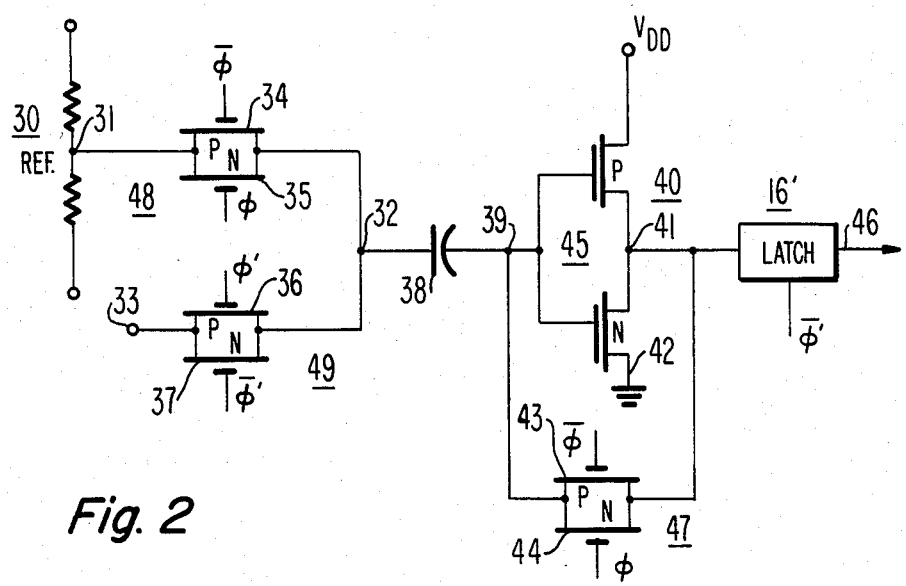
FIG. 2 is a schematic diagram of one comparator circuit realized in FET circuitry for utilization in a flash A/D converter.

FIG. 2 illustrates generally the comparator circuits employed in the A/D converter. Resistor 30 represents a portion of the reference potential dividing resistor or ladder (FIG. 1). A particular one of the 64 reference potentials is available at point 31.

The comparator includes a complementary symmetry or CMOS inverter 45 comprising P-type semiconductor 40 and N-type semiconductor 42 transistors connected in series between positive potential $V_{DD}$ and ground. A complementary transistor switch 47 including P-type transistor 43 and N-type transistor 44, responsive to control signals $\overline{\phi}$ and $\phi$ respectively, selectively connects the inverter output terminal 41 to the inverter input terminal 39. This self-biases the inverter at its mid or switch point. The bias potential is stored on the summing capacitor 38.

During the period that the inverter 45 output potential at terminal 41 is fed back to the input terminal 39 and capacitor 38, a second complementary transistor switch 48 comprising P-type transistor 34 and N-type transistor 35 respectively, responsive to control signals $\phi$ and $\overline{\phi}$ selectively connects the reference potential at point 31 to node 32 located on the other side of the summing capacitor 38. Switches 47 and 48 then turn off leaving the inverter 45 biased at its switch point and with the reference potential stored on node 32.

Immediately thereafter the third complementary transistor switch 49 including P-type transistor 36 and N-type transistor 37 respectively responsive to control signals $\phi'$ and $\overline{\phi'}$ connects the input signal at terminal 33 to node 32. If the input signal is greater or lesser than the reference potential, the potential difference is coupled across the summing capacitor 38 to the inverter input connection 39. The gain of the inverter is sufficiently high that the slightest deviation applied to the self bias potential will cause the output to switch to either a "high" output state (Vin less than Vref) or a "low" output state (Vin greater than Vref). The output state is applied to the input of LATCH 16' which stores the output state responsive to control signal $\overline{\phi'}$ going low.

The foregoing circuit and operational description comprises one complete signal sampling cycle of the comparator circuitry. The inverter self biases itself during every cycle which tends to eliminate stability problems due to parameter drifts. The control signals $\phi$ and $\overline{\phi}$ are complementary signals. Control signals $\phi'$ and $\overline{\phi'}$ are generally complementary signals substantially identical in duration and phase with signals $\phi$ and $\overline{\phi}$ respectively. Typically, the duration of these signals is designed to allow switches 47 and 48 to open before switch 49 closes, however, the system is operable even with a small degree of pulse overlap.

In the present invention the switching circuit is modified by the inclusion of a further FET having its drain and source electrodes serially connected between switch 49 and terminal 33. The gate electrode of the further FET is biased at a D.C. potential.

Figure 3:
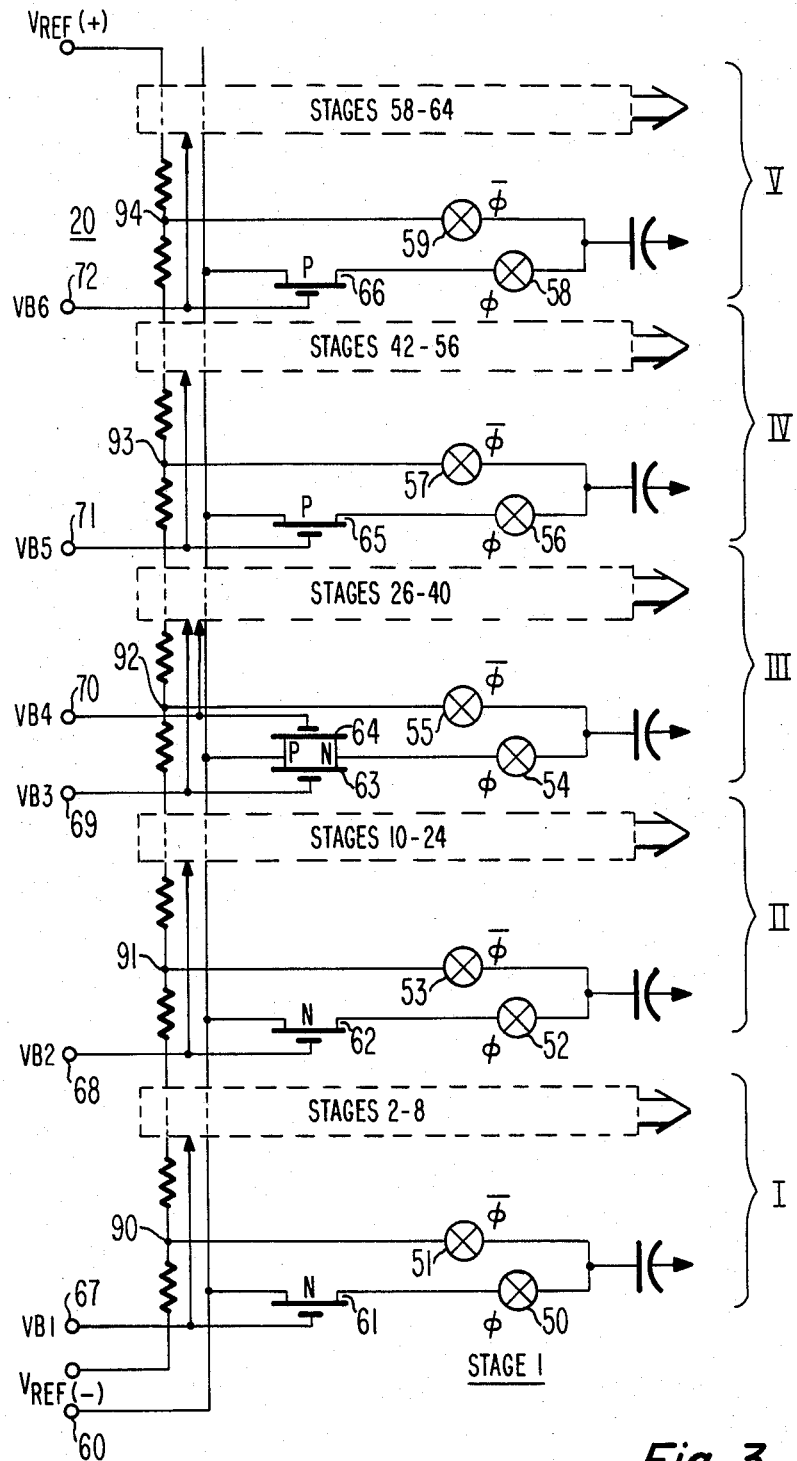
FIG. 3 is a partial block, partial schematic diagram of a comparator transmission gate arrangement incorporating blocking FET's connected serially with the signal input transmission gates to limit the degree of capacitor charge displacement.

FIG. 3 illustrates in part the comparator switch arrangement embodied in the present A/D flash converter. The switches are grouped in five categories designated I-V. The groups correspond generally to the range of reference potentials to which they are connected. Ideally each switch would be tailored to the respective reference potential to which it is connected however the support circuitry necessary to produce the bias potentials becomes prohibitive. The choice of five groups in the present illustrative case is therefore entirely arbitrary.

In FIG. 3 the circuit elements 50-59 are complementary FET transmission gates similar to elements 48 and 49 in FIG. 2. The two gates in each switching circuit are alternately energized to connect first the reference potential and then the input potential to the respective summing capacitor.

An N-type FET is serially connected between the input bus 60 and the respective input transmission gate in groups I and II. A P-type FET is serially connected between the input bus 60 and the respective input transmission gate in groups IV and V and a P-type and an N-type FET are paralleled in series between the input bus 60 and the respective input transmission gate in group III. P-type transistors are employed at transmission gates associated with the relatively positive taps on the ladder and N-type transistors are employed at transmission gates associated with the relatively negative ladder taps so that the gate bias potentials $V_{B1}$-$V_{B6}$ applied to terminals 67-72 can be generated from potentials substantially no more positive than $V_{REF}(+)$ or substantially more negative than $V_{REF}(-)$.

Assume for illustrative purposes that the transistors 61-66 are enhancement mode devices with the N-type devices having a positive one volt threshold potential and the P-type devices having a negative one volt threshold potential. Assume also that the bias potential $V_{B1}$ exceeds the reference potential at ladder tap 91 by at least one threshold potential, bias potential $V_{B2}$ exceeds the reference potential at ladder tap 92 by at least one threshold potential, and bias potential $V_{B3}$ exceeds the reference potential at ladder tap 93 by at least one threshold potential. Similarly assume bias potentials $V_{B6}$, $V_{B5}$ and $V_{B4}$ are respectively more negative than taps 93, 92 and 91 by at least one threshold potential.

FET's being bidirectional conduction devices will conduct in either direction depending upon the respective potentials appearing at their gate, drain and source electrodes. Nominally, in a FIG. 3 type arrangement the drain-source structure of the FET's is symmetrical and functionally the drain and source electrode designation is interchangeable. However if one of the drain/source electrodes is more positive than the gate electrode (N-type FET) and the other drain/source electrode is less positive than the gate electrode by at least a threshold potential, the drain/source electrode having the lower potential will function as a source electrode. If both the drain/source electrode potentials are less than the gate potential the distinction is unimportant in the present application.

Consider the group I section of the switch configuration when a relatively high, e.g. $V_{REF}(+)$, signal input potential is applied to terminal 60. In the absence of transistor 61 the summing capacitor would charge to $V_{REF}(+)$ during the sampling portion of a cycle, then discharge to $V_{REF}(-)$ through the ladder during the reference portion of a cycle. With transistor 61 in the circuit and $V_{REF}(+)$ applied to terminal 60, its leftmost and rightmost electrodes will function as drain and source respectively. Then when switch 50 is closed transistor 61 will operate as a source follower with the summing capacitance as a load. It is well known that the maximum potential the source electrode of an enhancement mode FET can achieve is a threshold potential less than the potential applied to its gate electrode, i.e. $V_{gate} - V_{TH}$. For the foregoing conditions the summing capacitors in stages 1–8 of the present apparatus cannot achieve a potential, due to the input signal, greater than $(V_{B1}-1)$ volts. The potential $(V_{B1}-1)$ volts has been established as being greater than the reference potentials applied to stages 1–8 and therefore the charging limitation to these summing capacitors will not affect the logical operation of the circuit, but it will reduce the charge displacement attendant the group I summing capacitors for relatively large input signals.

For signal input potentials less than $(V_{B1}-1)$ volts both the drain/source electrodes will equilibrate to the input potential.

The series transistors in group II have their gates biased more positively than the group I FET's since the FET's in group II must be capable of translating a larger input signal potential to the respective summing capacitors. For the same reasons the bias potential $V_{B3}$ applied to the gate electrodes of the group III FET's is larger than the group II bias $V_{B2}$.

Consider next the group V transistors. P-type FET's are utilized because they can be biased on with a potential which is relatively negative with respect to $V_{REF}(+)$. The use of N-type FET's at this location would require a bias potential more positive than $V_{REF}(+)$ and thus an additional potential source. More importantly N-type FET's would not effect a limitation in capacitor charging currents since the gate bias potential would of necessity be greater than the maximum range of input signals.

In group V the P-type transistor 66 operates in a complementary manner to N-type transistor 61. P-type transistor 66, operates in the source follower mode for relatively negative input signals precluding its respective summing capacitor from discharging its relatively positive reference potential below the value $(V_{B6}+1)$ volts. Similarly the P-type series FET's in group IV and III preclude discharge of the respective summing capacitors below $(V_{B5}+1)$ volts and $(V_{B4}+1)$ volts respectively.

The limited charging of the summing capacitors in groups I and II effected by the N-type series FET's and the limited discharging of the summing capacitors in groups IV and V effected by the P-type series FET's reduces the loading on the resistive ladder for input signals near the extremes of the input range, thereby enhancing system linearity. Since the potential swing on the summing capacitors is reduced, the time required to recharge and discharge the summing capacitors to the respective reference potential is decreased, and thus, system speed is enhanced.

The parallel P-type and N-type series FET's in group III are biased, in the present case, so that the potential on the respective summing capacitors may swing over the entire input range of potentials. Thus the series FET's in group III ostensibly have little effect regarding limiting capacitor displacement currents. However, the drain/source impedances of the group III series FET's do provide isolation of the input transmission gate clock feed through from the input signal bus 60. If there is sufficient range of bias potential for either $V_{B4}$ or $V_{B3}$ that the P-type 64 or the N-type 63 transistor can discharge/charge the respective summing capacitor at the desired system speed, one or the other of the P or N-type transistors may be eliminated from the circuit in which case the charging and discharging capacitor currents may be further reduced.

Figure 4:
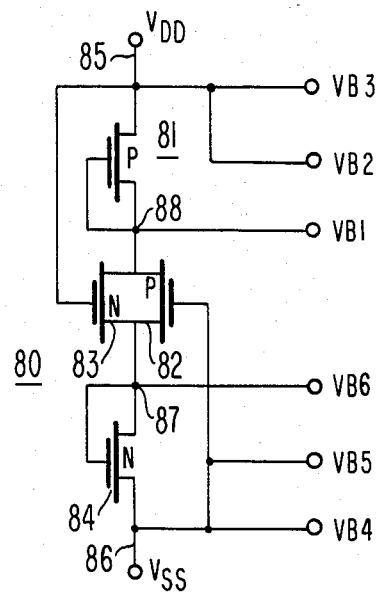
FIG. 4 is a schematic diagram of circuitry for generating D.C. potentials to bias the serially connected FET's in the FIG. 3 circuit.

FIG. 4 is a circuit for generating the bias potentials $V_{B1}$–$V_{B6}$ in a low voltage application of the FIG. 3 circuit, e.g. 5 volts supply potential. For this condition the reference potentials at taps 92 and 93 are approximately two and three volts respectively. The bias potential on the N-type series FET of state 24 must be greater than three volts in order to pass an input signal of two volts to the summing capacitor. In order to charge the capacitor rapidly it is necessary to have an overvoltage biasing the series FET. The FIG. 4 circuit provides a two volt overvoltage on the most positive stage of each of the groups I and II and IV and V. The effective overvoltage on each of the descending stages of groups I and II and each of the ascending stages of groups IV and V is proportionately greater. From the FIG. 4 schematic it will be seen that the bias voltage $V_{B2}$ is equal to supply potential $V_{DD}$, e.g. 5 volts, conditioning the FET's in group II to charge the capacitor in the source follower mode to a maximum potential of $(V_{B2}-V_T)$ or four volts. Thus the maximum potential swing on the respective capacitors is limited by one volt. Similarly $V_{B5}$ is connected directly to $V_{SS}$ e.g. zero volts which conditions the P-type FET's in group IV to discharge the respective capacitors in the source follower mode to $(V_{B5}-V_T)$ or one volt. Thus the maximum potential swing on the respective capacitors in group IV is reduced by one volt also. The FIG. 4 circuit also provides bias potentials $V_{B3}$ and $V_{B4}$ of five and zero volts respectively. However since the group III FETs are parallel complementary devices there is no reduction in the maximum potential swing of the corresponding summing capacitors. The reference potentials in this group range from two to three volts and therefore the maximum capacitor potential swing is at most three volts for input signals occurring in the operative range of the circuit.

The bias potential $V_{B1}$ produced by the FIG. 4 circuit is $(V_{DD}-V_T)$ or four volts and $V_{B6}$ is one volt. Thus the maximum signal charging potential at the group I capacitors is $(V_{B1}-V_T)$ or three volts and the minimum discharge potential at group V capacitor is $(V_{B6}-V_T)$ or two volts. The maximum potential swing on the group I and V capacitor is therefore reduced by two volts effecting a substantial reduction in loading of the reference ladder.

The bias potential generator 80 comprises a diode connected P-type FET 81 serially connected with a pair of parallel connected N-type 83 and P-type 82 FETs having their gates respectively connected to $V_{DD}$ and $V_{SS}$ supply potential, and a diode connected N-type FET 84. When current is passed through the serially connected FET's both P-type FET 81 and N-type FET 84 develop a drain-source potential of approximately 1 volt due to the respective gate-drain feedback connections. The potentials $V_{B1}$ at the drain 88 of FET 81 is $(V_{DD}-V_T)$ and the potential $V_{B6}$ at the drain 87 of FET 84 is $(V_{SS}+V_T)$ which corresponds to four and one volts respectively for $V_{DD}$ equal to 5 volts and $V_{SS}$ equal to ground potential. Since FET's 82 and 83 are biased linearly the excess supply potential is dropped across their source-drain connections. Note that for the FET's in the bias circuit 80 and the FET's in the switch circuit of FIG. 3 being constructed on the same integrated circuit the respective N and P-type threshold voltages can be made similar and being substantially in the same thermal environment will track with temperature variations.

It will readily be appreciated that for greater supply potentials a wider range of bias potentials can be provided by a FIG. 4 type circuit simply by serially including additional diode connected FET's. Bias voltages in increments of a threshold potential can then be tapped at the drain electrodes of the diode connected FET's.

Alternatively the bias voltages $V_{B1}-V_{B6}$ may be generated by a simple resistive divider connected between the supply potentials.

What is claimed is:

1. In a flash analog-to-digital converter for digitizing a range of applied input signals including a plurality of comparators, each comparator having a respective input terminal, a plurality of capacitors one of which is serially connected to the input terminal of each comparator, a signal input terminal for applying input signals and a source of a plurality of reference voltages incrementally ascending in value, sets of switch means for alternately serially coupling respective ones of said plurality of reference voltages or said signal input terminal to respective ones of said plurality of capacitors, means for limiting the maximum potential excursion in ones of said capacitors and thereby reducing loading of said source of reference potentials, said means comprising:

a plurality of N-type FET's each having respective drain, source and gate electrodes, respective ones of said N-type FET's having their drain and source electrodes serially coupled between said input terminal and respective ones of said capacitors which are alternately coupled to respective ones of said reference voltages which are in a relatively negative range of said ascending reference voltages;

a plurality of P-type FET's each having respective drain, source and gate electrodes, respective ones of said P-type FET's having their drain and source electrodes serially coupled between said input terminal and respective ones of said capacitors which are alternately coupled to respective ones of said reference voltages which are in a relatively positive range of said ascending reference voltages;

means for applying D.C. bias potential to the gate electrodes of said N-type FET's, said bias potential conditioning respective ones of the N-type FET's to limit the maximum potential which can be coupled from said input terminal to respective ones of said capacitors; and means for applying D.C. bias potential to the gate electrodes of said P-type FET's for conditioning respective ones of the P-type FET's to limit the minimum potential which can be coupled from said input terminal to respective ones of said capacitors, said N-type and P-type FET's operating in the source follower mode over respective portions of said range of applied input signals to reduce the loading of said source.

2. The analog-to-digital converter set forth in claim 1 further comprising:

a plurality of parallel connected P-type and N-type FET's each having common source connections, common drain connections, an N-type FET gate electrode and a P-type gate electrode, respective ones of said parallel connected FET's having their common source and common drain connections serially coupled between said input terminal and respective ones of said capacitors which are alternately coupled to respective ones of said reference voltages which are in a mid-range of said ascending reference voltages;

means for applying D.C. bias potential to the N-type FET gate electrodes of said parallel connected FET's for conditioning said N-type FET's to couple a relatively negative range of input signals from said input terminal to said capacitors; and means for applying D.C. bias potential to the P-type FET gate electrodes of said parallel connected FET's for conditioning said P-type FETs to couple a relatively positive range of input signals from said input terminal to said capacitors, wherein said negative range of input signals overlaps said positive range of input signals so that an entire range of input signals is coupled to said capacitors.

3. In a flash analog-to-digital converter of the type including a plurality of summing capacitors, a source of a plurality of incrementally ascending reference voltages, a signal input terminal and switch means for alternately coupling respective ones of said plurality of summing capacitors to said signal input terminal and respective ones of said reference voltages further including means for limiting the maximum potential excursion at respective summing capacitors to limit loading of said source of reference voltages, said means comprising:

a plurality of N-type FET's having respective drain, source and gate electrodes, respective ones of said N-type FET's having their drain and source electrodes serially coupled between said signal input terminal and respective capacitors that are alternately coupled to respective reference voltages in a relatively negative range of said reference voltages;

a plurality of P-type FET's having respective drain, source and gate electrodes, respective ones of said P-type FET's having their drain and source electrodes serially coupled between said input terminal and respective summing capacitors that are alternately coupled to respective reference voltages in a relatively positive range of said ascending reference voltages;

means for applying D.C. bias potential to the gate electrodes of said N-type FET's to charge the respective summing capacitor coupled thereto in a source follower mode for a relatively positive range of input signals applied to said input terminal, the capacitor potential being limited by said bias potential in said positive range; and means for applying D.C. bias potential to the gate electrodes of said P-type FET's for conditioning said P-type FET's to discharge the respective summing capacitors coupled thereto in a source-follower mode for a range of input signals applied to said input terminal less than the D.C. bias potential applied to said P-type FET's, the degree of capacitor discharge being limited by said bias potential in said range.

4. The analog-to-digital converter set forth in claim 3 wherein the gate electrodes of adjacent FET's are grouped, each group of gate electrodes receiving a common bias potential, the common bias potentials applied to groups of N-type FET's associated with more positive reference voltages being more positive in value than to groups of N-type FET's associated with more negative reference voltages; and the common bias potentials applied to groups of P-type FET's associated with more negative reference voltages being more negative in value than to groups of P-type FET's associated with more positive reference voltages.

5. The analog-to-digital converter set forth in claim 3 or 4 wherein the summing capacitors alternately coupled to a midrange of said reference voltages are serially coupled to said input terminal through the parallel connection of respective pairs of P-type and N-type FET's.

6. A flash analog-to-digital converter including a plurality of comparators, each comparator having a respective input terminal, a plurality of capacitors one of which is serially connected with the input terminal of each comparator, a signal input terminal and a plurality of reference voltages incrementally ascending in value, sets of switch means for alternately serially coupling respective ones of said plurality of reference voltages or said signal input terminal to respective ones of said plurality of capacitors, and respective transistors serially coupled between the signal input terminal and said sets of switch means, each of said transistors biased to operate in the source follower mode at least over a range of signal input potentials, for limiting the maximum potential excursion on ones of said capacitors to thereby reduce loading of said reference potentials.

* * * * *